(12) United States Patent
Tamaki et al.

(10) Patent No.: US 11,467,185 B2
(45) Date of Patent: Oct. 11, 2022

(54) TEST SOCKET AND METHOD OF MANUFACTURING THE SAME

(71) Applicant: SHARP KABUSHIKI KAISHA, Sakai (JP)

(72) Inventors: Kazuo Tamaki, Sakai (JP); Yasuki Fukui, Sakai (JP); Naruki Hara, Sakai (JP); Masataka Yamashita, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 225 days.

(21) Appl. No.: 16/998,717

(22) Filed: Aug. 20, 2020

(65) Prior Publication Data

US 2021/0063442 A1 Mar. 4, 2021

(30) Foreign Application Priority Data

Aug. 30, 2019 (JP) .............................. JP2019-158588

(51) Int. Cl.
| | | |
|---|---|---|
| *G01R 1/073* | (2006.01) | |
| *G01R 1/04* | (2006.01) | |
| *G01R 1/07* | (2006.01) | |
| *H01R 33/74* | (2006.01) | |
| *G01R 31/26* | (2020.01) | |
| *G01R 31/311* | (2006.01) | |

(52) U.S. Cl.
CPC ....... *G01R 1/07307* (2013.01); *G01R 1/0408* (2013.01); *G01R 1/0433* (2013.01); *G01R 1/0466* (2013.01); *G01R 1/071* (2013.01); *G01R 31/26* (2013.01); *G01R 31/311* (2013.01); *H01R 33/74* (2013.01); *H01R 2201/20* (2013.01)

(58) Field of Classification Search
CPC ............. G01R 1/07307; G01R 1/0408; G01R 1/0466; G01R 1/071
See application file for complete search history.

(56) References Cited

U.S. PATENT DOCUMENTS

| | | |
|---|---|---|
| 6,297,654 B1 | 10/2001 | Barabi |
| 2006/0205247 A1 | 9/2006 | Kunioka et al. |
| 2009/0075514 A1 | 3/2009 | Saitoh et al. |

FOREIGN PATENT DOCUMENTS

| | | | | |
|---|---|---|---|---|
| CN | 206332306 U | * | 7/2017 | |
| JP | 2004-6199 A | | 1/2004 | |
| JP | 2004-103432 A | | 4/2004 | |
| JP | 2009-89373 A | | 4/2009 | |
| JP | 2009-123713 A | | 6/2009 | |
| JP | 2014-154265 A | | 8/2014 | |
| JP | 2017-142182 A | | 8/2017 | |
| JP | 2018-040678 A | | 3/2018 | |
| KR | 1801711 B1 | * | 12/2017 | ........... G01R 1/0466 |

* cited by examiner

*Primary Examiner* — Paresh Patel

(74) *Attorney, Agent, or Firm* — ScienBiziP, P.C.

(57) ABSTRACT

A first base plate includes a plurality of first positioning hole portions, an accommodation portion that accommodates an optical module, a first opening portion, a first pressing portion, and a first engagement portion. A second base plate has a second positioning hole portion that is disposed at a position corresponding to the first positioning hole portion, a second opening portion that is disposed at a predetermined positional relationship with respect to the second positioning hole portion, a second holding portion, a conduction portion, a second pressing portion, a substrate portion, a cover portion, a second hinge portion, and a second engagement portion.

10 Claims, 16 Drawing Sheets

TEST SOCKET AND METHOD OF MANUFACTURING THE SAME

BACKGROUND

1. Field

The present disclosure relates to a test socket for an optical module and a method of manufacturing the same.

2. Description of the Related Art

In the related art, in a process of manufacturing an optical module or the like, in order to inspect whether the optical module is a good product or a defective product, various tests are performed using a tester that performs electrical tests, characteristic evaluations, and the like. A test of the optical module is performed generally while the optical module to be inspected disposed in a test socket is connected to the tester. It is preferable that in order to perform a test of the optical module with high accuracy, a focus and an angle of view of the optical module are adjusted as accurately as possible, so that the optical module is placed at a predetermined position of a test socket.

For example, Japanese Unexamined Patent Application Publication No. 2009-123713 discloses a cartridge for a probe pin, in which a substrate disposed to face a positioning member and another substrate having the same outer shape as that of the substrate are vertically stacked, and a plurality of probe pins are held by these substrates.

Further, Japanese Unexamined Patent Application Publication No. 2018-40678 discloses a measurement socket in which in a state in which an electronic module is mounted on a base, the electronic module is covered with a second cover, then covered with a first cover, and thus accurately positioned, so that reliable conduction can be obtained.

However, when the configurations of Japanese unexamined Patent Application Publication No. 2009-123713 and Japanese Unexamined Patent Application Publication No. 2018-40678 are adopted to the test socket for an optical module, the test socket is dedicated for a certain optical module. If the shape or the like of the optical module is changed for each product, there is a problem in that it is necessary to make a dedicated test socket for each shape of the optical module. Further, the test socket is usually monolithically manufactured by resin molding, shaving, and laser processing, and correction or fine adjustment of the positioning components is difficult. That is, there is a problem in that it is difficult to assemble the test socket at low cost with high accuracy to cope with the change of the type of the optical module to be inspected.

It is desirable to provide a test socket that can cope with a change of the type of the optical module at low cost with high accuracy.

SUMMARY

In order to solve the above problems, a test socket for an optical module according to an aspect of the present disclosure includes: a first base plate that accommodates the optical module; and a second base plate that is detachably attached to the first base plate and sandwiches the optical module between the first base plate and the second base plate. The first base plate has: a plurality of first positioning hole portions; an accommodation portion that has a first holding portion disposed in a predetermined positional relationship with respect to the plurality of first positioning hole portions, and accommodates the optical module; a first opening portion that is formed in the accommodation portion; a first pressing portion that protrudes from the first opening portion and presses the optical module toward a side of the second base plate; a first hinge portion that rotatably attaches the second base plate; and a first engagement portion that is disposed at a position different from a position of the first hinge portion and engages with the second base plate.

The second base plate includes a plurality of second positioning hole portions that are arranged at positions corresponding to the plurality of first positioning hole portions of the first base plate; a second opening portion that is disposed at a predetermined positional relationship with respect to the plurality of second positioning hole portions and is disposed at a position corresponding to a lens of the optical module; a second holding portion that holds the optical module from the side of the second base plate; a conduction portion that is disposed at a position facing a connector of the optical module and includes a contact pin connected to the connector; a second pressing portion that presses a circuit board of the optical module; a substrate portion that is electrically connected to the contact pin of the conduction portion; a cover portion that protects the substrate portion; a second hinge portion that is connected to the first hinge portion; and a second engagement portion that is disposed at a position different from a position of the second hinge portion and engages with the first engagement portion.

DESCRIPTION OF THE EMBODIMENTS

Embodiment 1

Figure 1:
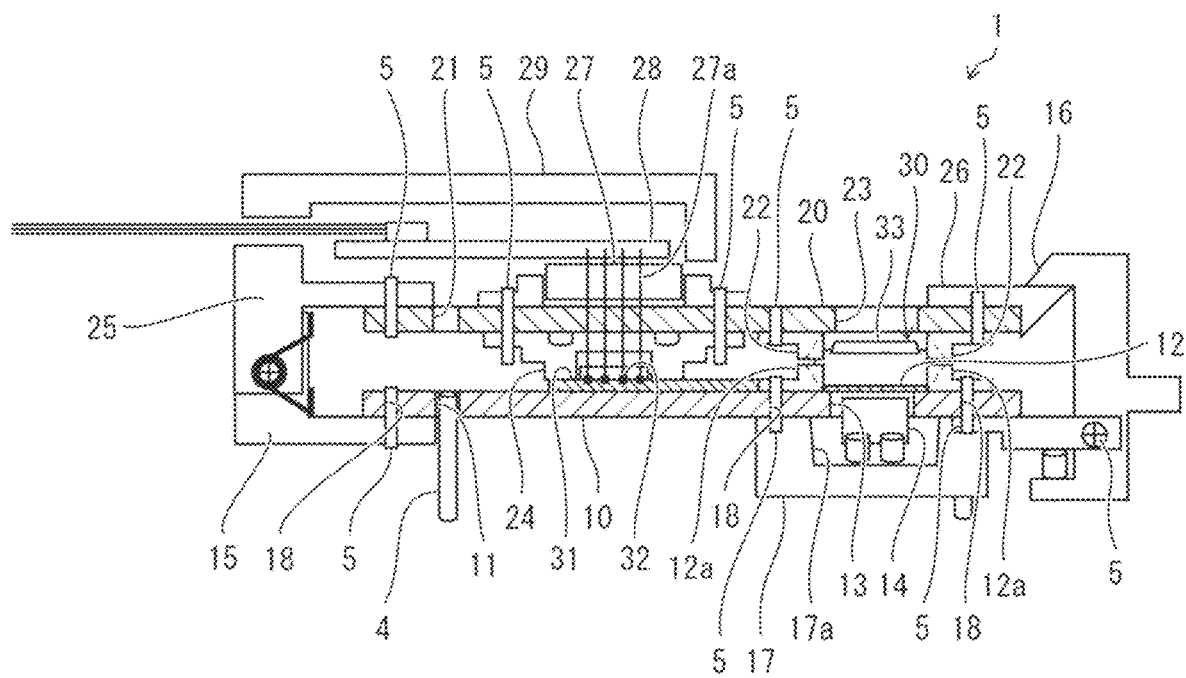
FIG. 1 is a diagram illustrating an overall configuration of a test socket according to Embodiment 1 of the present disclosure.
Figure 2:
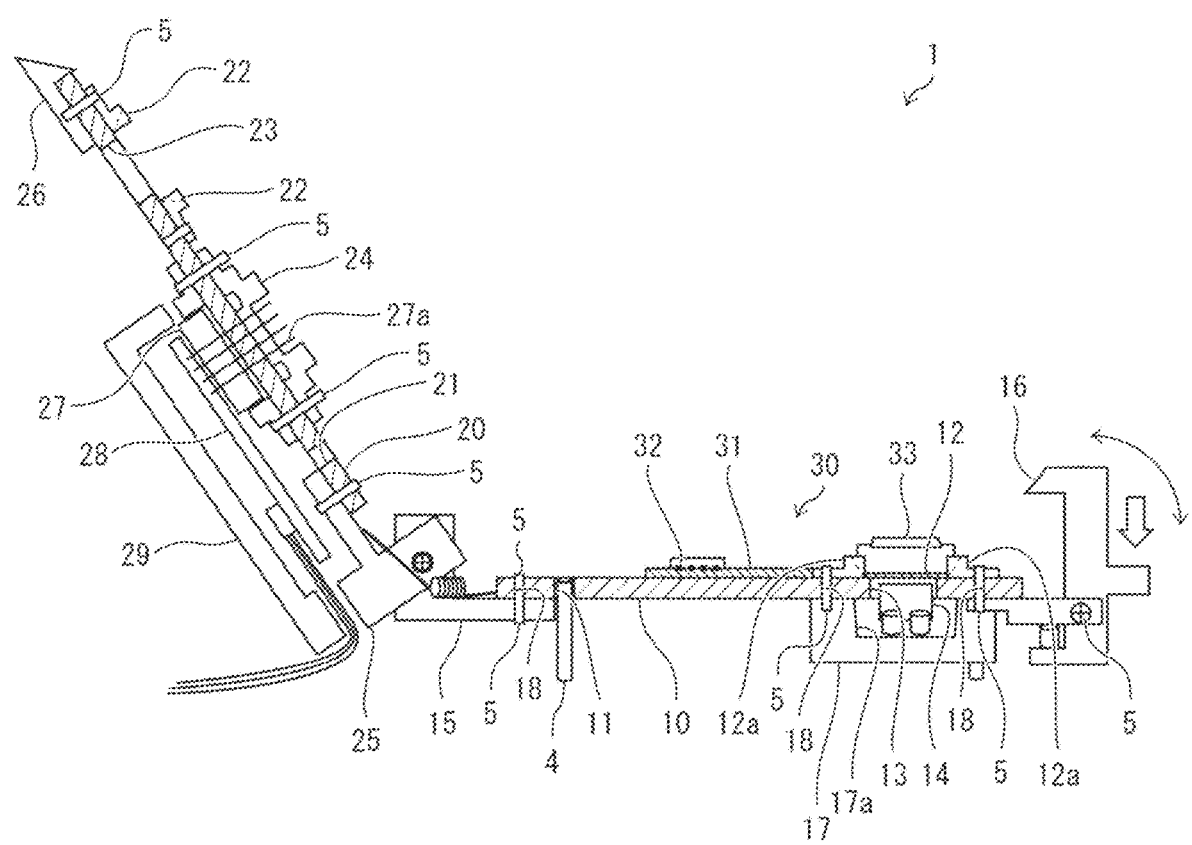
FIG. 2 is a diagram illustrating a state in which a first base plate and a second base plate of the test socket of FIG. 1 are separated from each other.

Hereinafter, a test socket according to Embodiment 1 of the present disclosure will be described with reference to FIGS. 1 to 5. FIG. 1 is a diagram illustrating an overall configuration of a test socket 1 according to Embodiment 1. FIG. 2 is a diagram illustrating a state in which a first base plate 10 and a second base plate 20 of the test socket 1 of FIG. 1 are separated from each other.

The test socket 1 illustrated in FIGS. 1 and 2 is a socket for implementing various tests on an optical module 30 in a state in which the optical module 30 to be measured is disposed on the first base plate 10 and is connected to a tester that is not illustrated. The optical module 30 has a circuit board 31, a connector 32, and a lens 33. The test socket 1 includes the first base plate 10 and the second base plate 20 that accommodate the optical module 30.

First Base Plate

The first base plate 10 has a plurality of first positioning hole portions 11, an accommodation portion 12 that accommodates the optical module 30, a first opening portion 13, a first pressing portion 14, a first hinge portion 15, and a first engagement portion 16, an accommodation member 17, and a through-hole 18. The first base plate 10 is made of a non-magnetic conductor, for example, non-magnetic stainless steel, conductive-type UNILATE (resin material manufactured by Unitika Ltd.), or the like, and is electrically grounded via the first engagement portion 16. Accordingly, crosstalk and noise can be reduced.

Figure 3:
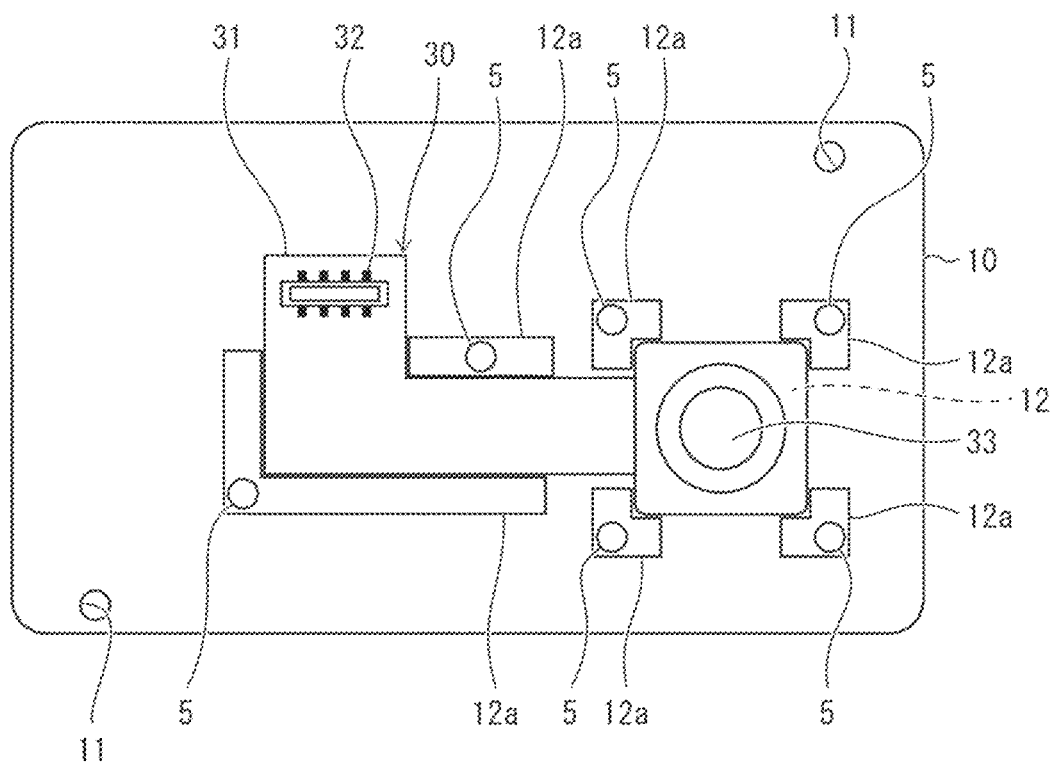
FIG. 3 is a view of the first base plate of FIG. 1 when viewed from above.

FIG. 3 is a view of the first base plate 10 of FIG. 1 when viewed from above. As illustrated in FIG. 3, the first base plate 10 is provided with two first positioning hole portions 11 that have a circular shape. The two first positioning hole portions 11 are formed, for example, by etching on an upper right end portion side and a lower left end portion side of the first base plate 10 illustrated in FIG. 3. A connection pin 4 that connects the test socket 1 and the tester is inserted through each first positioning hole portion 11.

The accommodation portion 12 has four first holding portions 12a protruding from a peripheral part thereof. These first holding portions 12a are detachably fixed to the first base plate 10 by attaching fixing members 5 such as screws to the through-holes 18. The first holding portions 12a are arranged in a predetermined positional relationship with respect to the first positioning hole portions 11. In detail, when the outer shape accuracy of a portion of the optical module 30 into which the lens 33 is inserted is set to, for example, a design value of ±30 μm or less, the positional accuracy of the first positioning hole portion 11 and each first holding portion 12a is set to a design value of ±50 μm, and an interval between the first holding portions 12a is also set to a design value of ±50 μm or less.

The accommodation portion 12 is provided with, for example, the first opening portion 13 that has a circular shape at a position corresponding to the portion of the optical module 30 into which the lens 33 is inserted. The first opening portion 13 is formed in the first base plate 10 by, for example, etching. The shape of the first opening portion 13 can be appropriately changed according to the shape of the portion into which the lens 33 is inserted.

For example, the first pressing portion 14 that has a cylindrical shape is provided below the first opening portion 13 illustrated in FIGS. 1 and 2. The accommodation member 17 is disposed below the first opening portion 13 of the first base plate 10. The accommodation member 17 is provided with a recess portion 17a at a position corresponding to the first opening portion 13. The first pressing portion 14 is accommodated in the recess portion 17a of the accommodation member 17. The first pressing portion 14 protrudes from the first opening portion 13 and presses the optical module 30 toward the second base plate 20 side.

The first hinge portion 15 is provided on one end portion side (the left end portion side in FIGS. 1 and 2) of the first base plate 10. The first hinge portion 15 is a member for rotatably attaching the second base plate 20 to the first base plate 10. The first hinge portion 15 is detachably fixed to the first base plate 10 by the fixing member 5.

The first engagement portion 16 is provided at a position different from the first hinge portion 15 of the first base plate 10, that is, on the other end portion side (the right end portion side in FIGS. 1 and 2) of the first base plate 10. The first engagement portion 16 is detachably fixed to the first base plate 10 by the fixing member 5 such as a screw. Further, as indicated by an arrow in FIG. 2, the first engagement portion 16 has a rotatable hinge that is not illustrated and has a openable/closable structure. The first engagement portion 16 engages with a second engagement portion 26 of the second base plate 20. The first base plate 10 and each of the first holding portion 12a, the first hinge portion 15, and the first engagement portion 16 are not limited to be fixed by the fixing member 5, but may be detachably fixed by an adhesive.

Second Base Plate

The second base plate 20 is a member that is detachably attached to the first base plate 10 and sandwiches the optical module 30 between the second base plate 20 and the first base plate 10. The second base plate 20 includes a plurality of second positioning hole portions 21, a second holding portion 22, a second opening portion 23, a second pressing portion 24, a second hinge portion 25, the second engagement portion 26, a conduction portion 27, a substrate portion 28, and a cover portion 29. The second base plate 20 is formed of a non-magnetic conductor, for example, non-magnetic stainless steel, a conductive-type UNILATE (resin material manufactured by Unitika Ltd.) or the like.

Figure 4:
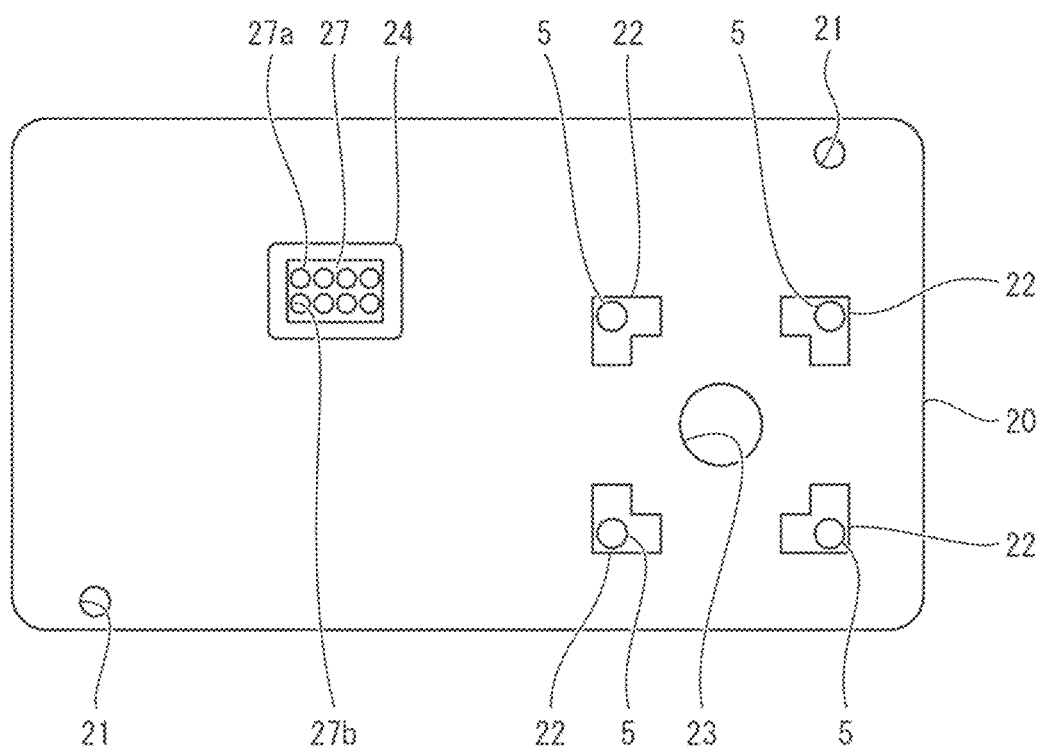
FIG. 4 is a perspective view illustrating the second base plate of FIG. 1 when viewed from above.
Figure 5:
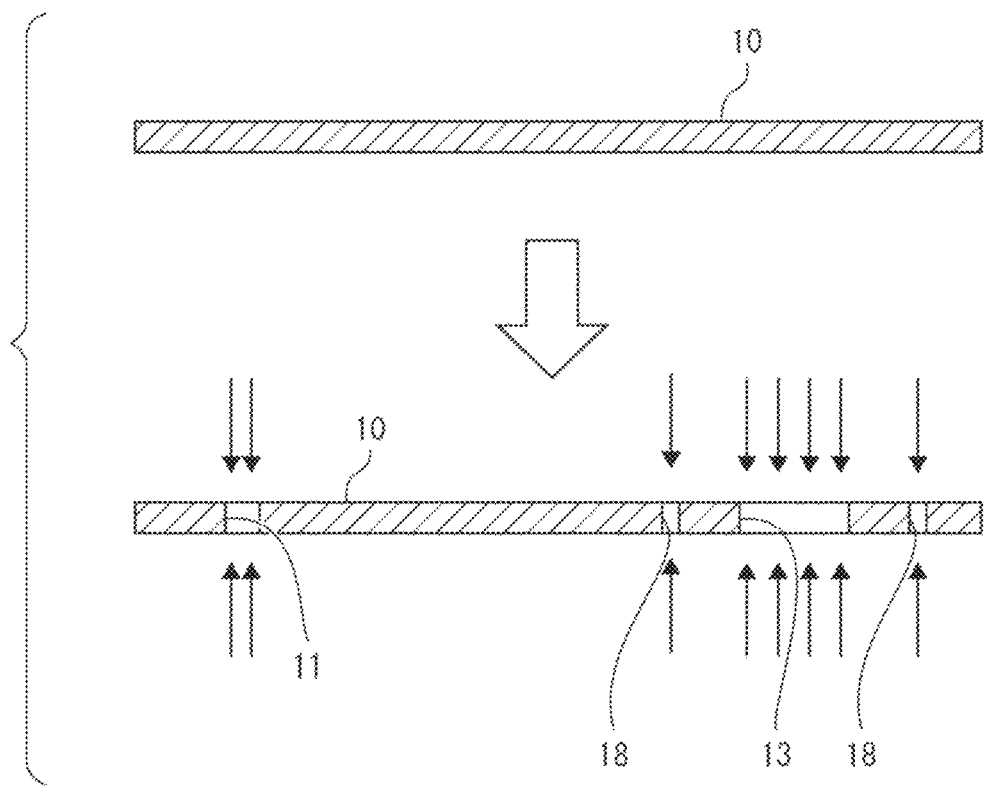
FIG. 5 is a diagram illustrating etching on the first base plate of FIG. 1.

FIG. 4 is a perspective view illustrating the second base plate 20 of FIG. 1 when viewed from above. As illustrated in FIG. 4, the second base plate 20 is provided with the two second positioning hole portions 21 that have a circular shape. The two second positioning hole portions 21 are respectively provided at positions corresponding to the two first positioning hole portions 11 of the first base plate 10, that is, on an upper right end portion side and a lower left end portion side of the second base plate 20 illustrated in FIG. 4.

The second base plate 20 has, for example, the second opening portion 23 that has a circular shape at a position corresponding to the lens 33 of the optical module 30, that is, a position corresponding to the first opening portion 13 of the first base plate 10. The second opening portion 23 is formed in the second base plate 20 by, for example, etching. The shape of the second opening portion 23 can be appropriately changed according to the shape of the lens 33.

The second holding portion 22 and the conduction portion 27 are arranged in a predetermined positional relationship with respect to the two second positioning hole portions 21. In detail, the second holding portion 22 and the conduction portion 27 are arranged such that, for example, a design value is ±50 µm or less with reference to the positions of the second positioning hole portions 21. Accordingly, in a state in which the second base plate 20 is attached to the first base plate 10, the optical module 30 can be accurately disposed between the first holding portion 12a and the second holding portion 22, and a contact pin 27a can be accurately connected to the connector 32 of the optical module 30.

Four second holding portions 22 are provided on the lower surface of the second base plate 20 illustrated in FIG. 1. The second holding portions 22 protrude from positions corresponding to the four first holding portions 12a of the first base plate 10. In a state in which the optical module 30 is sandwiched between the first base plate 10 and the second base plate 20, these second holding portions 22 abut the four first holding portions 12a of the first base plate 10, respectively.

Further, the conduction portion 27 is provided at a position facing the connector 32 of the optical module 30 on the upper surface of the second base plate 20 illustrated in FIG. 1. A plurality of contact pins 27a extend from the conduction portion 27 toward the first base plate 10 side. The contact pin 27a is connected to the connector 32 of the optical module 30 via a second through-hole 27b formed in the second base plate 20.

As also illustrated in FIG. 4, the second through-hole 27b is disposed in a predetermined positional relationship from the second positioning hole portions 21 and insulated. By insulating the second through-hole 27b, a short circuit can be prevented from occurring between the second through-hole 27b and the contact pins 27a. Further, the second through-hole 27b can be processed simultaneously with the second positioning hole portion 21 by etching or the like, so that positional accuracy of the contact pins 27a can be improved.

As illustrated in FIG. 1, the second pressing portion 24 protrudes from the lower surface of the second base plate 20 toward the first base plate 10 side. The second pressing portion 24 is fixed to the second base plate 20 by the fixing member 5. The second pressing portion 24 is a member that is disposed on the outer peripheral portion of each contact pin 27a of the conduction portion 27 and presses the circuit board 31 of the optical module 30.

The substrate portion 28 that has a rectangular plate shape is disposed above the conduction portion 27 of the second base plate 20 illustrated in FIG. 1. The substrate portion 28 is electrically connected to each contact pin 27a of the conduction portion 27. The cover portion 29 is provided above the substrate portion 28 to cover the substrate portion 28. The cover portion 29 is a member for protecting the substrate portion 28.

As illustrated in FIGS. 1 and 2, the second hinge portion 25 is provided on one end portion side (left end portion side in FIG. 1) of the second base plate 20. The second hinge portion 25 is connected to the first hinge portion 15 of the first base plate 10 with a screw, an elastic member, or the like. Accordingly, the second base plate 20 is rotatably attached to the first base plate 10.

The second engagement portion 26 is provided on the other end portion side (right end portion side in FIG. 1) of the second base plate 20. The second base plate 20 is rotatably attached to the first base plate 10. As illustrated in FIG. 2, from a state in which the first base plate 10 and the second base plate 20 are separated from each other, when the second base plate 20 is rotated to the first base plate 10 side, by rotating the first engagement portion 16 having a hinge that is not illustrated, the first base plate 10 is closed by the second base plate 20 as illustrated in FIG. 1. In this way, the optical module 30 can be disposed at a predetermined position of the first base plate 10 with high positioning accuracy.

According to the test socket 1 in Embodiment 1 that is described above, the positions of the first positioning hole portions 11 of the first base plate 10 and the positions of the second positioning hole portions 21 of the second base plate 20 are aligned with each other, and the optical module 30 is sandwiched between the first base plate 10 and the second base plate 20, so that the optical module 30 can be disposed at a predetermined position of the test socket 1 with high accuracy within, for example, ±50 µm. In particular, when the shape, the size, or the like of the optical module 30 is changed, only the first base plate 10 is replaced and the position of each portion of the first base plate 10 is adjusted, so that it is possible to cope with a change of the type of the optical module 30 that is a test object at low cost.

Further, the first holding portion 12a, the first hinge portion 15, and the first engagement portion 16 of the first base plate 10 are detachably fixed to the first base plate 10 by the fixing member 5. The second hinge portion 25, the second engagement portion 26, and the second conduction portion 27 of the second base plate 20 are detachably fixed to the second base plate 20 by the fixing member 5. Accordingly, the position of each portion of the first base plate 10 and the position of each portion of the second base plate 20 can be easily adjusted. Further, the shape of the accommodation portion 12 of the first base plate 10 and the arrangement position of each first holding portion 12a can be easily changed.

As the plurality of first positioning hole portions 11 and the first opening portion 13 of the first base plate 10 and the plurality of second positioning hole portions 21 and the second opening portion 23 of the second base plate 20 are formed by etching, the accuracy of alignment of the optical module 30 with respect to the test socket 1 can be improved.

Embodiment 2

Figure 6:
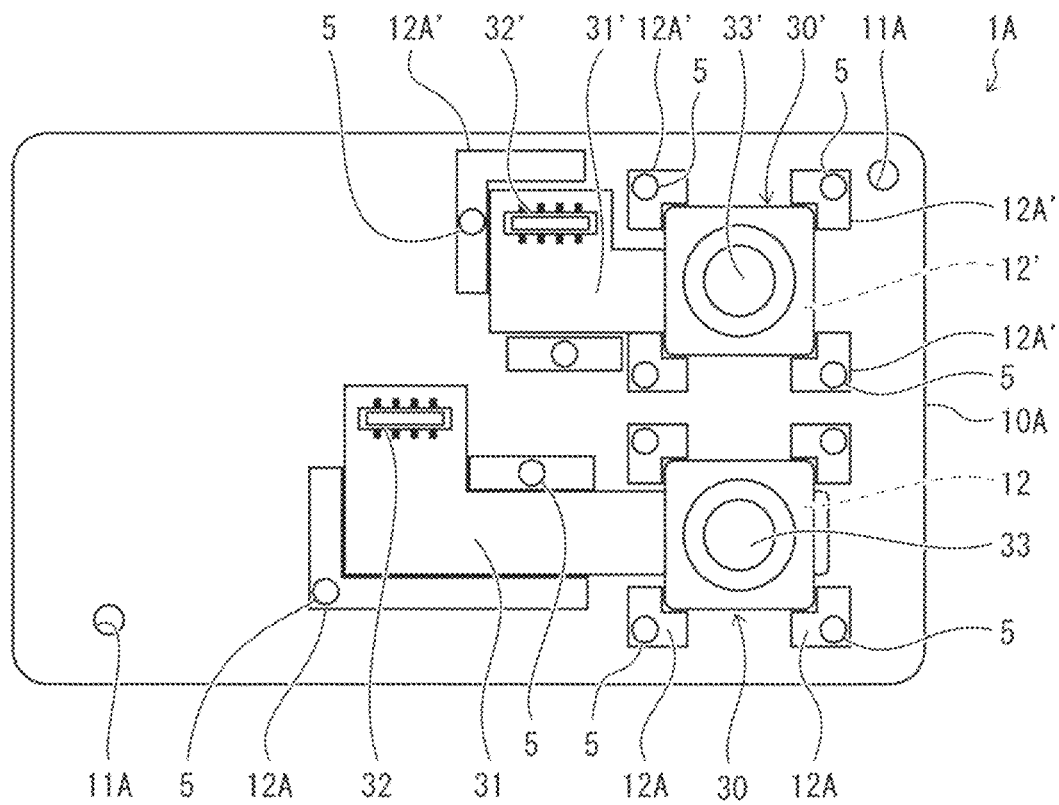
FIG. 6 is a diagram illustrating a first base plate of a test socket according to Embodiment 2 of the present disclosure.
Figure 7:
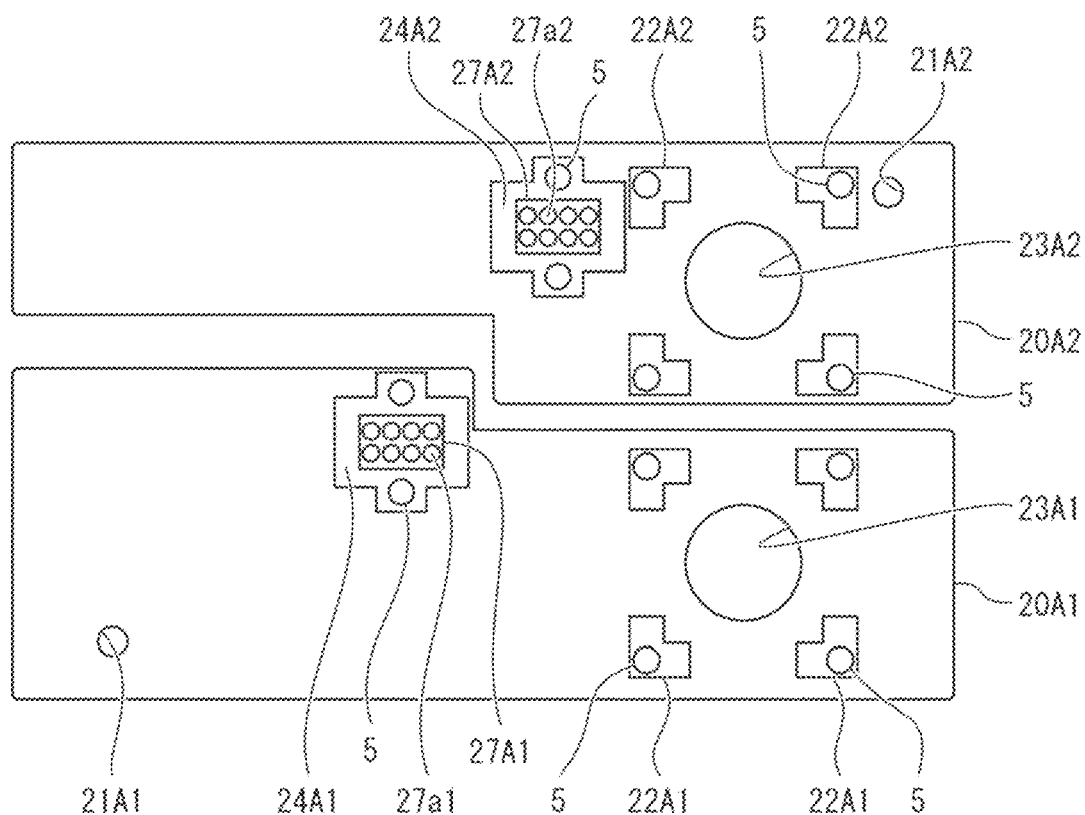
FIG. 7 is a diagram illustrating a second base plate of the test socket according to Embodiment 2.

A test socket according to Embodiment 2 of the present disclosure will be described with reference to FIGS. 6 and 7. For convenience of description, members having the same functions as those of the members described in Embodiment 1 are designated by the same reference symbols, and description thereof will not be repeated. FIG. 6 is a diagram illustrating a first base plate 10A of a test socket 1A according to Embodiment 2 when viewed from above. FIG. 7 is a perspective view illustrating second base plates 20A1 and 20A2 of the test socket 1A according to Embodiment 2 when viewed from above.

As illustrated in FIGS. 6 and 7, the test socket 1A of Embodiment 2 differs from the test socket 1 of Embodiment 1 in that a plurality of, in this case, two optical modules 30 and 30' are arranged on the first base plate 10A, and the two second base plates 20A1 and 20A2 are attached to the first base plate 10A.

First Base Plate

The first base plate 10A includes two first positioning hole portions 11A and two accommodation portions 12 and 12', and a first opening portion, a first pressing portion, a first hinge portion, a first engagement portion, an accommodation member, and a through-hole, which are not illustrated. The second base plate 20A1 for sandwiching the optical module 30 is attached to the first base plate 10A. Similarly, the second base plate 20A2 for sandwiching the optical module 30' is attached to the first base plate 10A.

The optical module 30 having the circuit board 31, the connector 32, and the lens 33 is accommodated in the accommodation portion 12. A plurality of (in this case, six) first holding portions 12A are provided on a peripheral part of the accommodation portion 12 in a protruding manner. These first holding portions 12A are fixed to the first base plate 10A by attaching the fixing members 5 such as screws to the through-holes 18. The first holding portions 12A are arranged in a predetermined positional relationship with respect to the first positioning hole portions 11A. In detail, when the outer shape accuracy of an insertion part of the lens 33 of the optical module 30 is, for example, a design value of ±30 µm or less, the distance accuracy from the first positioning hole portion 11A to the first holding portion 12A is set to ±50 µm or less, and an interval between the four first holding portions 12A is also set to a design value of ±50 µm or less.

The optical module 30' having a circuit board 31', a connector 32', and a lens 33' is accommodated in the accommodation portion 12'. A plurality of (in this case, six) first holding portions 12A' are provided on a peripheral part of the accommodation portion 12' in a protruding manner. These first holding portions 12A' are fixed to the first base plate 10A by attaching the fixing members 5 such as screws to the through-holes 18. The first holding portions 12A' are arranged in a predetermined positional relationship with respect to the first positioning hole portions 11A. In detail, when the outer shape accuracy of an insertion part of the lens 33' of the optical module 30' is, for example, a design value of ±30 µm or less, the distance accuracy from the first positioning hole portion 11A to the first holding portion 12A' is set to ±50 µm or less, and an interval between the four first holding portions 12A' is also set to a design value of ±50 µm or less.

Second Base Plate

As illustrated in FIG. 7, the second base plate 20A1 includes a second positioning hole portion 21A1, a second holding portion 22A1, a second opening portion 23A1, a second pressing portion 24A1, and a second conduction portion 27A1 including a plurality of contact pins 27a1, and a second hinge portion, a second engagement portion, a substrate portion, and a cover portion, which are not illustrated. The second base plate 20A1 is disposed at a position corresponding to the accommodation portion 12 of the first base plate 10A.

The second base plate 20A2 includes a second positioning hole portion 21A2, a second holding portion 22A2, a second opening portion 23A2, a second pressing portion 24A2, a second conduction portion 27A2 including a plurality of contact pins 27a2, and a second hinge portion, a second engagement portion, a substrate portion, and a cover portion which are not illustrated. The second base plate 20A2 is disposed at a position corresponding to the accommodation portion 12' of the first base plate 10A. The second base plate 20A1 and the second base plate 20A2 may have the same height or may partially have different heights.

According to the above-described test socket 1A of Embodiment 2, since the two second base plates 20A1 and the second base plate 20A2 are attached to the first base plate 10A having the plurality of accommodation portions 12 and 12' to correspond to the plurality of accommodation portions 12 and 12', the two optical modules 30 and 30' can be arranged in the test socket 1A at high positioning accuracy. Further, since the second base plates 20A1 and 20A2 are independent base plates, optical modules having different heights can be tested at one time, and the number of devices can be reduced.

Embodiment 3 a test socket 1B according to Embodiment 3 of the present disclosure will be described with reference to FIGS. 8 and 9. For convenience of description, members having the same functions as those described in Embodiment 1 will be designated by the same reference symbols, and description thereof will not be repeated.

Figure 8:
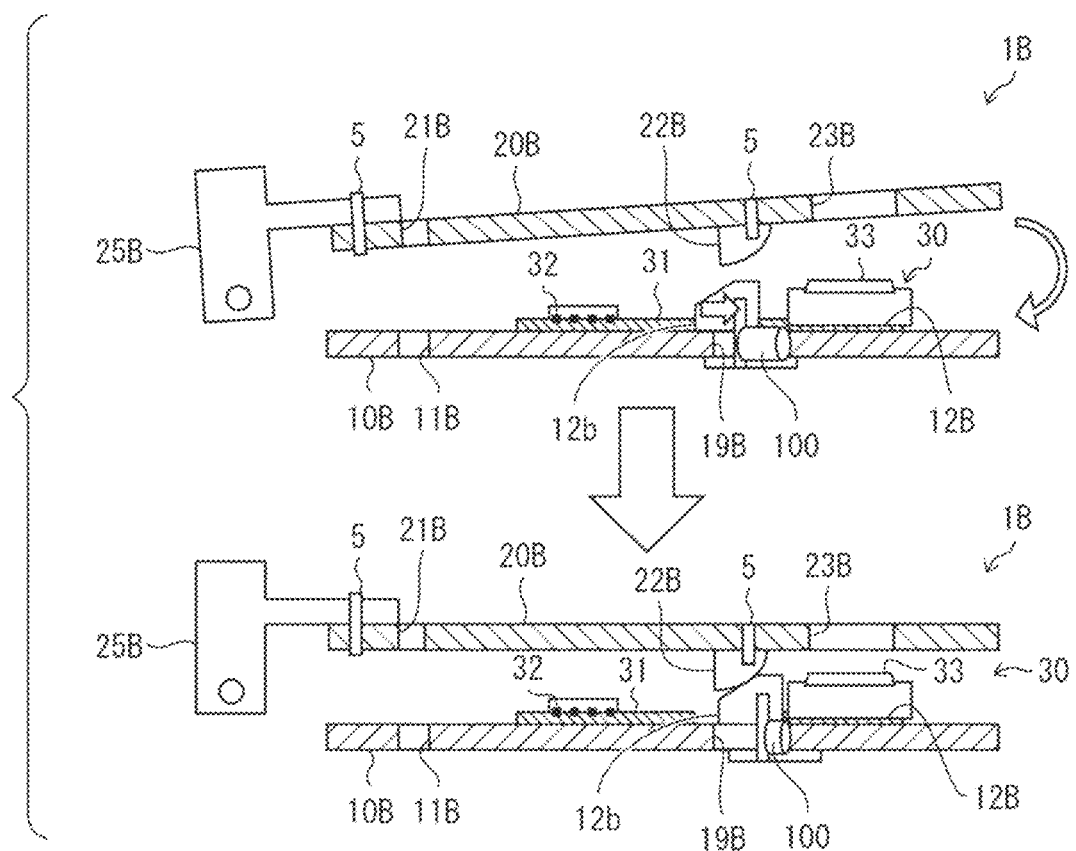
FIG. 8 is a schematic view illustrating an opened state and a closed state of a test socket according to Embodiment 3 of the present disclosure.

FIG. 8 is a schematic view illustrating an opened state and a closed state of the test socket 1B according to Embodiment 3. FIG. 9 is a perspective view illustrating the test socket 1B according to Embodiment 3. As illustrated in FIGS. 8 and 9, the test socket 1B includes a first base plate 10B and a second base plate 20B. The first base plate 10B accommodates the optical module 30.

First Base Plate

The first base plate 103 has two first positioning hole portions 11B, an accommodation portion 12B that accommodates the optical module 30, a first holding portion 12b, a biasing member 100, and a slit portion 19B.

Figure 9:
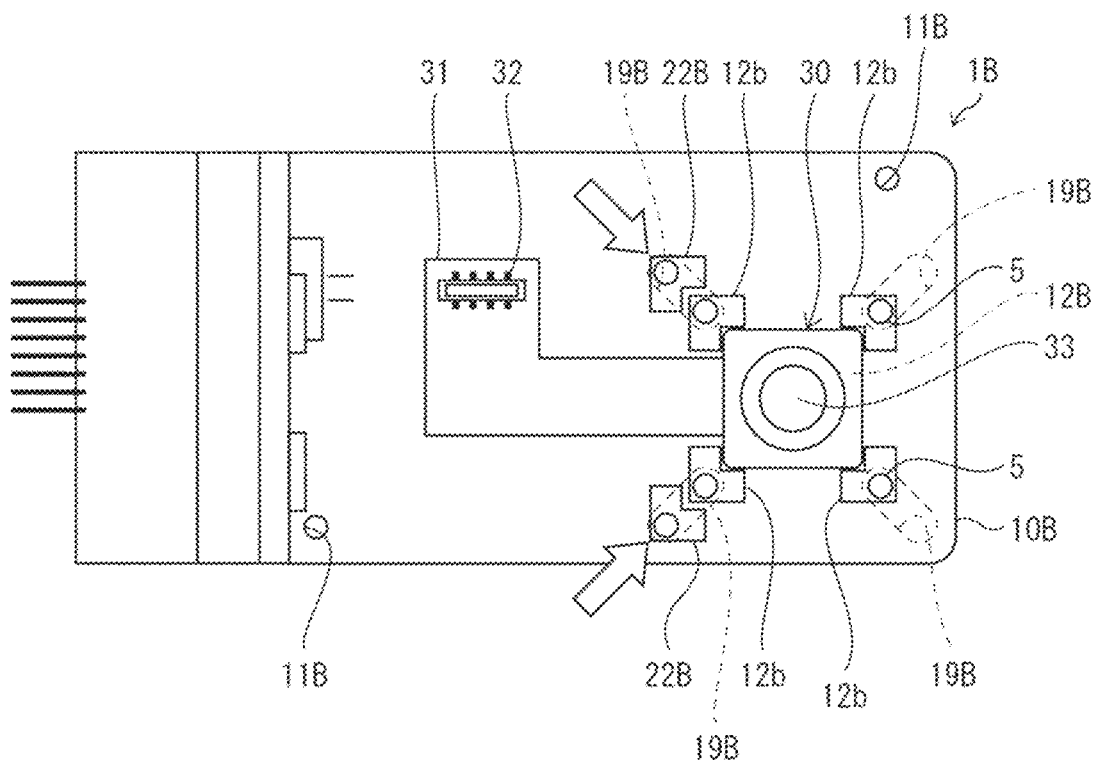
FIG. 9 is a perspective view illustrating the test socket according to Embodiment 3 when viewed from above.

The two first positioning hole portions 11B are respectively provided on an upper right end portion side and a lower left end portion side of the first base plate 10B illustrated in FIG. 9. The accommodation portion 12B is provided with four first holding portions 12b protruding from a peripheral part thereof. These first holding portions 12b are arranged in a predetermined positional relationship with respect to the first positioning hole portions 113. In detail, in a state in which the optical module 30 is disposed, the positional accuracy of the first holding portion 12b with respect to the first positioning hole portion 11B is set to, for example, ±50 µm or less.

The slit portion 19B is formed at a position corresponding to the first holding portion 12b of the first base plate 10B. The biasing member 100 is accommodated in the slit portion 19B. The first holding portion 12b of the first base plate 10B is biased toward the optical module 30 side by the biasing member 100.

Second Base Plate

The second base plate 20B has a plurality of second positioning hole portions 21B, a second holding portion 22B, a second opening portion 23B, and a second hinge portion 25B. The second holding portion 22B abuts the first holding portion 12b of the first base plate 10B. Accordingly, as indicated by an arrow in FIG. 9, a biasing force of the biasing member 100 biases the second holding portion 22B of the second base plate 20B and the first holding portion 12b of the first base plate 10B toward the lens 33 side of the optical module 30.

As described above, according to the test socket 1B of Embodiment 3, by applying the biasing force to the optical module 30 side by the biasing member 100, the positioning accuracy of the optical module 30 to the test socket 1B can be improved.

Modification Example 1

A test socket 1C according to Modification Example 1 of Embodiment 3 of the present disclosure will be described with reference to FIGS. 10 and 11. For convenience of description, members having the same functions as those described in Embodiment 3 will be designated by the same reference symbols, and description thereof will not be repeated.

First Base Plate

Figure 10:
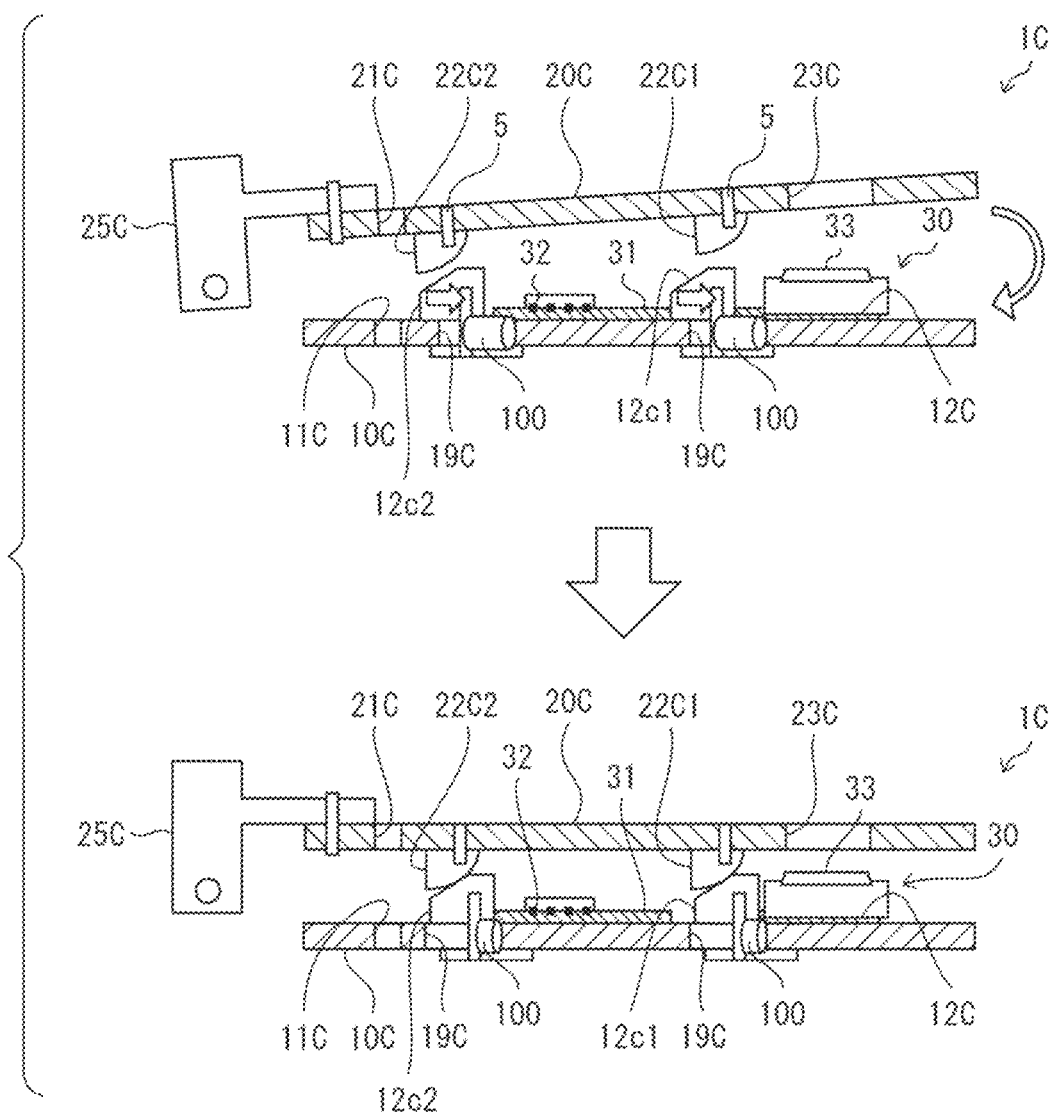
FIG. 10 is a schematic view illustrating an opened state and a closed state of a test socket according to Modification Example 1 of Embodiment 3.

FIG. 10 is a schematic view illustrating an opened state and a closed state of the test socket 1C according to Modification Example 1 of Embodiment 3. FIG. 11 is a perspective view of the test socket 1C according to Embodiment 3 when viewed from above. As illustrated in FIGS. 10 and 11, the first base plate 10C includes two first positioning hole portions 11C, an accommodation portion 12C that accommodates the optical module 30, first holding portions 12$c$1 and 12$c$2, the biasing member 100, and a slit portion 19C.

Figure 11:
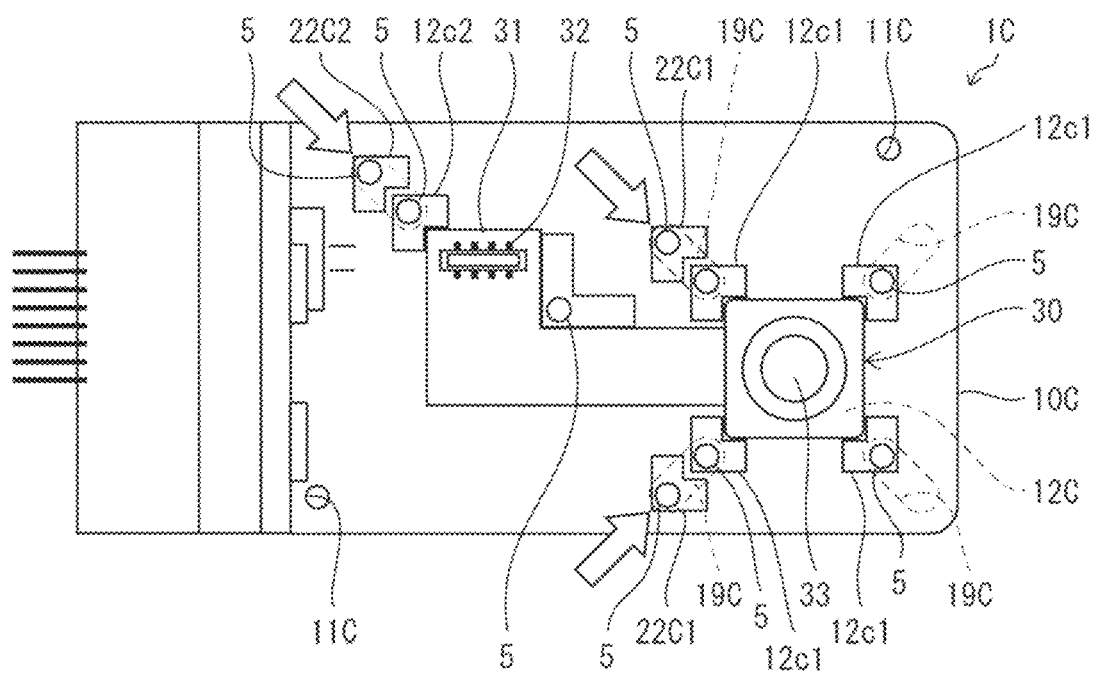
FIG. 11 is a transparent view illustrating a test socket according to Modification Example 1 when viewed from above.

The two first positioning hole portions 11C illustrated in FIG. 11 are provided on the upper right end portion side and the lower left end portion side of the first base plate 10C, respectively. In the accommodation portion 12C, the first holding portions 12$c$1 and 12$c$2 are arranged in a peripheral part of the optical module 30. These first holding portions 12$c$1 and 12$c$2 are arranged in a predetermined positional relationship with respect to the two first positioning hole portions 11C. In detail, the positional accuracy of the first holding portions 12$c$1 and 12$c$2 with respect to the first positioning hole portion 11C in a state in which the optical module 30 is disposed is set to be, for example, ±50 μm or less. The slit portion 19C is formed at a position corresponding to the first holding portion 12$c$1 of the first base plate 10C. The biasing member 100 is accommodated in the slit portion 19C.

The second base plate 20C has a plurality of second positioning hole portions 21C, second holding portions 22C1 and 22C2, a second opening portion 23C, and a second hinge portion 25C. The second holding portion 22C1 abuts the first holding portion 12$c$1. The second holding portion 22C2 abuts the first holding portion 12$c$2. Then, as indicated by an arrow in FIG. 11, the second holding portion 22C1 and the first holding portion 12$c$1 are biased toward the lens 33 side of the optical module 30 by the biasing member 100. Further, the second holding portion 22C2 and the first holding portion 12$c$2 are biased toward the circuit board 31 side of the optical module 30 by the biasing member 100.

As described above, even in the test socket 1C of Modification Example 1, by applying the biasing force to the optical module 30 side by the biasing member 100, the positioning accuracy of the optical module 30 to the test socket 1C can be improved.

Embodiment 4

A test socket 1D according to Embodiment 4 of the present disclosure will be described with reference to FIG. 12. For convenience of description, members having the same functions as those described in Embodiment 1 will be designated by the same reference symbols, and description thereof will not be repeated.

Figure 12:
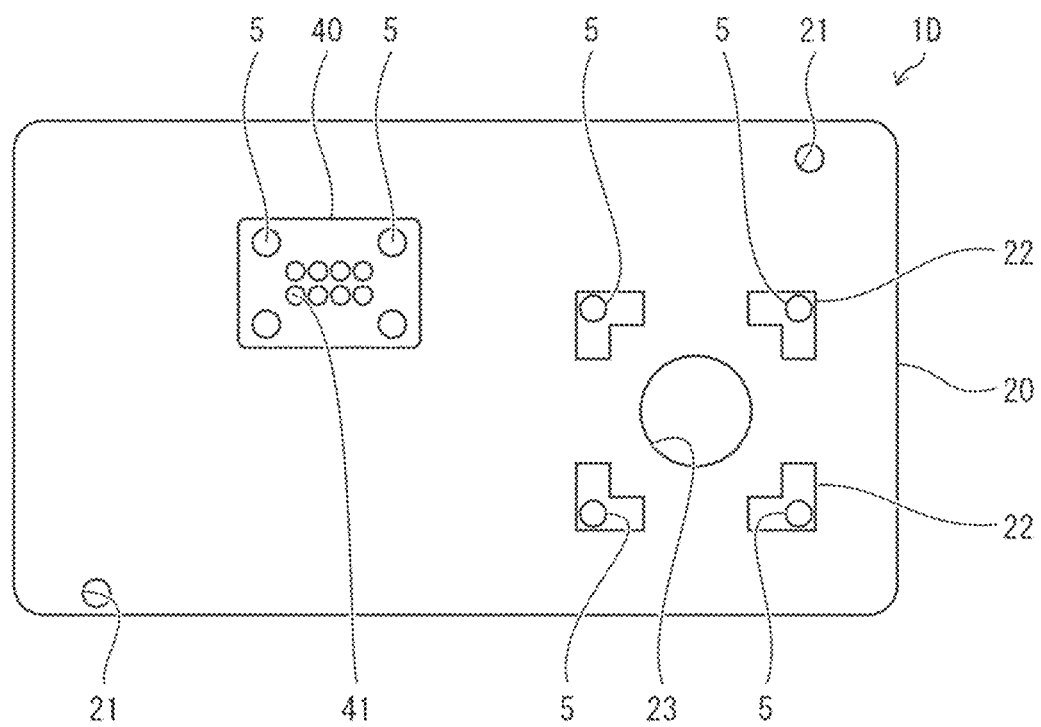
FIG. 12 is a perspective view of a test socket according to Embodiment 4 of the present disclosure when viewed from above.

FIG. 12 is a perspective view of the test socket 1D according to Embodiment 4 when viewed from above. As illustrated in FIG. 12, in the test socket 1D of Embodiment 4, a third base plate 40 is disposed on the second base plate 20. The third base plate 40 is fixed to the second base plate 20 by the fixing members 5 such as screws. The third base plate 40 may be disposed below the second base plate 20.

A plurality of third positioning holes 41 are formed in the third base plate 40. The contact pins 27$a$ of the second base plate 20 are inserted into the plurality of third positioning holes 41, respectively. The third base plate 40 is positioned with respect to the second base plate 20 with reference to the third positioning holes 41.

As described above, in the test socket 1D according to Embodiment 4, by providing the third base plate 40 that is positioned and fixed to the second base plate 20, the positional accuracy of the contact pins 27$a$ can be improved and the attachment position can be adjusted. Thus, the contact pins 27$a$ can be prevented from coming off from the connector 32 of the optical module 30.

Embodiment 5

A test socket 1E according to Embodiment 5 of the present disclosure will be described with reference to FIGS. 13 to 15. For convenience of description, members having the same functions as the members described in the above embodiments are designated by the same reference symbols, and description thereof will not be repeated.

Figure 13:
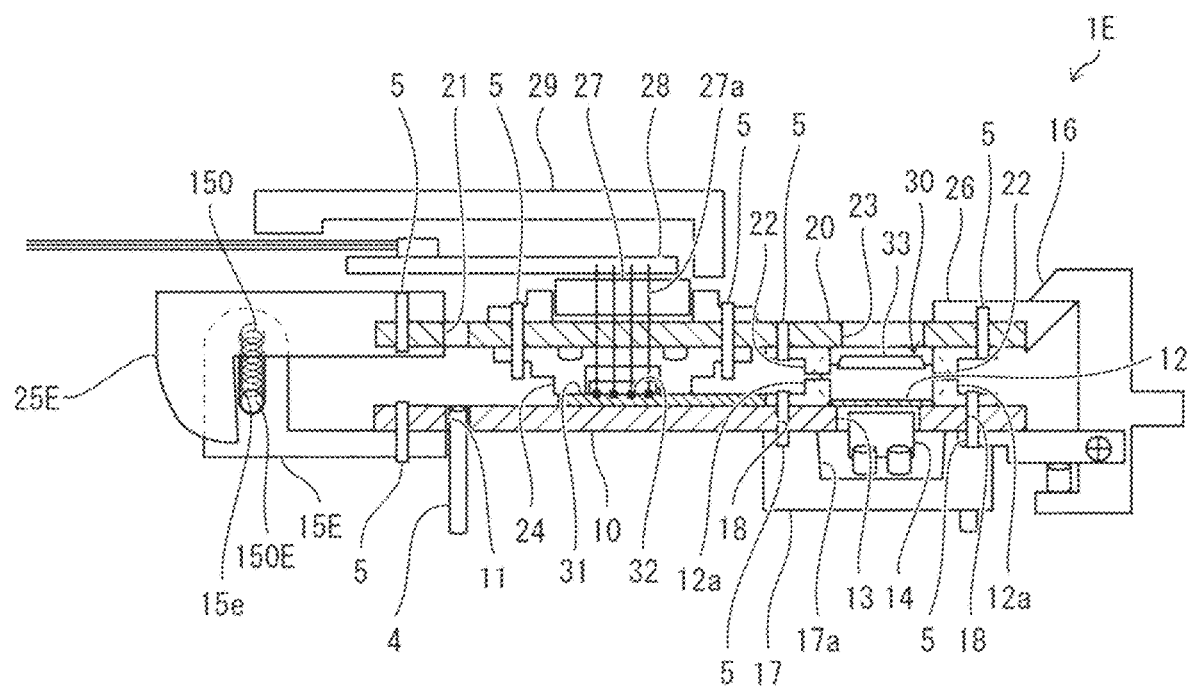
FIG. 13 is a diagram illustrating an overall configuration of a test socket according to Embodiment 5 of the present disclosure.

FIG. 13 is a diagram illustrating an overall configuration of the test socket 1E according to Embodiment 5. FIG. 14 is a diagram illustrating a rotating state of a first hinge portion 15E and a second hinge portion 25E of the test socket 1E of FIG. 13. FIG. 15 is a perspective view of the first hinge portion 15E of the test socket 1E of FIG. 13.

Figure 14:
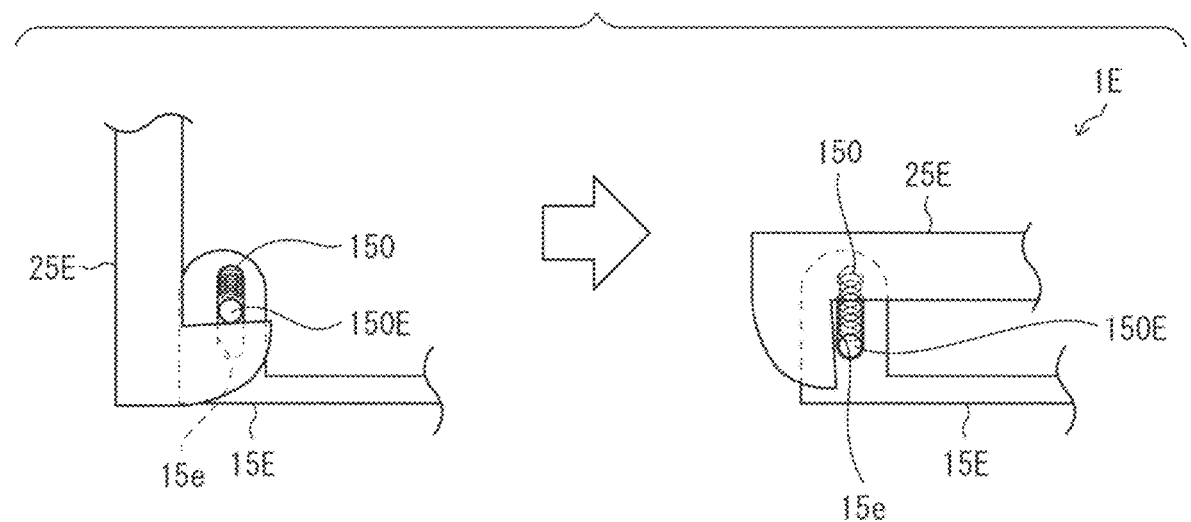
FIG. 14 is a diagram illustrating a rotating state of a first hinge portion and a second hinge portion of the test socket of FIG. 13.
Figure 15:
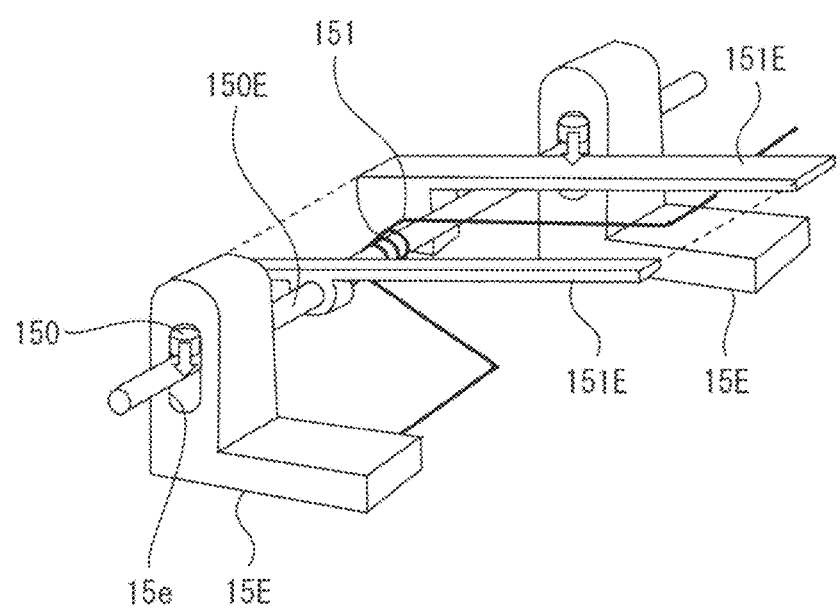
FIG. 15 is a perspective view illustrating the first hinge portion of the test socket of FIG. 13.

As illustrated in FIGS. 13 to 15, in the test socket 1E of Embodiment 5, an elliptical insertion hole 15$e$ is formed in the first hinge portion 15E. A hinge shaft 150E is inserted through the insertion hole 15$e$. An elastic member 150 such as a spring is accommodated above the hinge shaft 150E inside the insertion hole 15$e$.

An elastic member 151 including a spring or the like is wound around a central part of the hinge shaft 150E. One end of the elastic member 151 is fixed to the first hinge portion 15E of the first base plate 10, and the other end is fixed to the elastic member 151E attached to the second base plate 20. As illustrated in a right view of FIG. 14, when the second hinge portion 25E of the second base plate 20 is rotated toward the first hinge portion 15E of the first base plate 10, an elastic force of the elastic member 150 in a contracted state causes the hinge shaft 150E to move to the lower side of the insertion hole 15$e$. Further, the hinge shaft 150E is adapted to be biased downward of the insertion hole 15$e$ by the elastic member 151 illustrated in FIG. 15.

As illustrated in FIG. 13, in a state in which the first base plate 10 and the second base plate 20 are closed, the conduction portion 27 of the second base plate 20 is disposed in parallel to the first base plate 10. As a result, the contact pin 27$a$ provided in the conduction portion 27 can be vertically opposite to the connector 32 of the optical module 30 accommodated in the accommodation portion 12 of the first base plate 10 with high accuracy.

In a state in which the test socket 1E is opened, as illustrated in a left view of FIG. 14, a semicircular key portion of the second hinge portion 25E of the second base plate 20 pushes up the hinge shaft 150E to contract the elastic member 150.

According to the above-described test socket 1E of Embodiment 5, the hinge shaft 150E is pressed to the lower side of the insertion hole 15$e$ by the elastic force of the elastic member 150 accommodated in the insertion hole 15$e$ of the first hinge portion 15E, and the hinge shaft 150E is biased toward the lower side of the insertion hole 15$e$ by the elastic member 151. Accordingly, the movement of the test socket 1E between the first base plate 10 and the second base plate 20 in a rotational direction can be suppressed, the test socket 1E can be held more parallel, and the positional accuracy of the optical module 30 to the test socket 1E can be improved.

Embodiment 6

Figure 16:
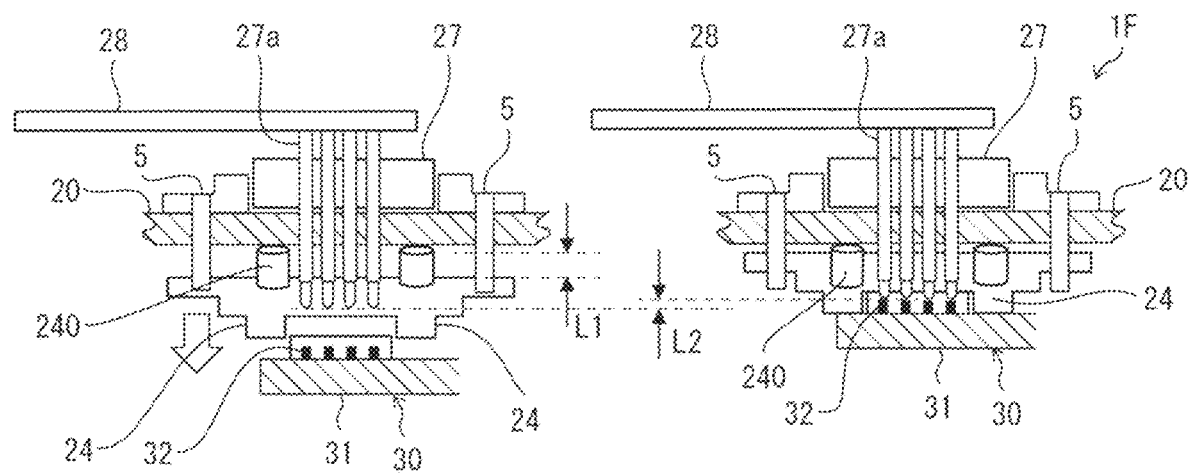
FIG. 16 is a diagram illustrating a periphery of a second pressing portion of a test socket according to Embodiment 6 of the present disclosure.

A test socket 1F according to Embodiment 6 of the present disclosure will be described with reference to FIG. 16. For convenience of description, members having the same functions as those described in Embodiment 1 will be designated by the same reference symbols, and description thereof will not be repeated. FIG. 16 is a diagram illustrating a periphery of a second pressing portion 24 of a test socket 1F according to Embodiment 6. As illustrated in FIG. 16, in the test socket 1F according to Embodiment 6, a movable member 240 is provided in the second pressing portion 24 of the second base plate 20. The movable member 240 includes a spring member, a pogo pin member, and the like.

The movable member 240 is a member that is elastically deformed in a pressing direction (vertical direction in FIG. 16) of the second pressing portion 24. The movable member 240 is disposed on the outer peripheral side of the contact pin 27a of the conduction portion 27.

A left view of FIG. 16 illustrates a state in which the second pressing portion 24 of the second base plate 20 and the circuit board 31 of the optical module 30 are not in contact with each other. When the second pressing portion 24 of the second base plate 20 is pressed toward the first base plate 10, the second pressing portion 24 and the circuit board 31 come into contact with each other. Further, when the second pressing portion 24 is pressed toward the circuit board 31, the movable member 240 moves in the pressing direction, and the movable member 240 is pressed in the pressing direction by a predetermined amount, so that a right view of FIG. 16 is obtained.

In a state illustrated in the right view of FIG. 16, the plurality of contact pins 27a are respectively connected to the connectors 32 of the optical module 30. At this time, a change amount L1 of the movable member 240 of the second pressing portion 24 in the pressing direction is larger than a pressed amount L2 of the contact pin 27a of the conduction portion 27.

According to the test socket 1F of Embodiment 6, the movable member 240 provided in the second pressing portion 24 of the second base plate 20 is disposed on the outer peripheral side of the contact pin 27a, and the change amount L1 of the movable member 240 in the pressing direction is larger than the pressed amount L2 of the contact pin 27a. Accordingly, the connector 32 of the optical module 30 disposed in the first base plate 10 and the conduction portion 27 of the second base plate 20 can be surely conducted to each other, and the positioning accuracy of the optical module 30 to the test socket 1F can be improved.

Modification Example 2

A test socket 1G according to Modification Example 2 of Embodiment 6 of the present disclosure will be described with reference to FIG. 17. For convenience of description, members having the same functions as those described in Embodiment 1 will be designated by the same reference symbols, and description thereof will not be repeated.

Figure 17:
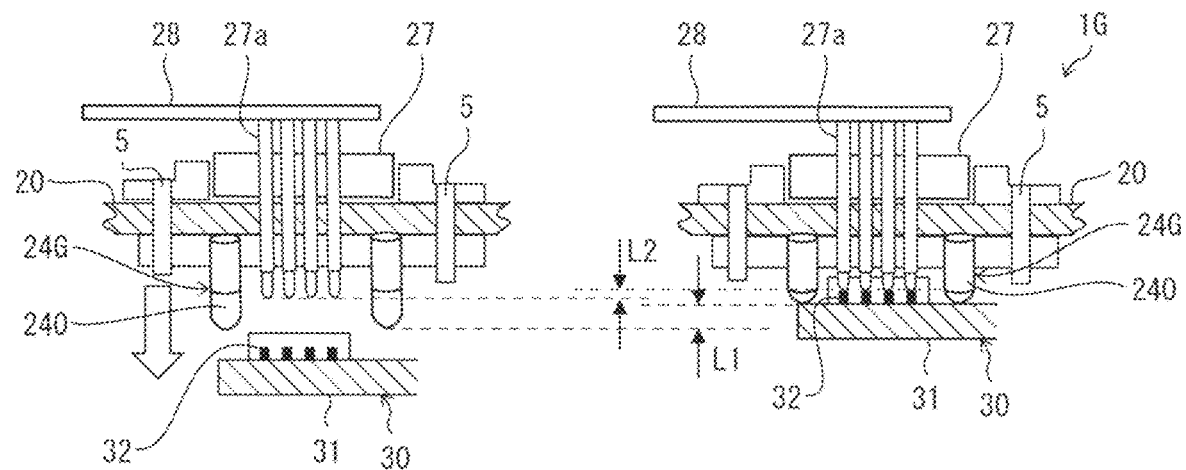
FIG. 17 is a diagram illustrating a periphery of a second pressing portion of a test socket according to Modification Example 2 of Embodiment 6.

FIG. 17 is a diagram illustrating a periphery of a second pressing portion 24G of the test socket 1G according to Modification Example 2 of Embodiment 6. As illustrated in a right view of FIG. 17, the test socket 1G according to Modification Example 2 differs from the test socket 1F according to Embodiment 6 in that the movable member 240 of the second pressing portion 24G is directly in contact with the circuit board 31 of the optical module 30.

In a state illustrated in the right view of FIG. 17, the plurality of contact pins 27a are connected to the connectors 32 of the optical module 30, respectively. At this time, the change amount L1 of the movable member 240 of the second pressing portion 24G in the pressing direction is larger than the pressed amount L2 of the contact pin 27a of the conduction portion 27.

According to the test socket 1G of Modification Example 2, the connector 32 of the optical module 30 disposed in the first base plate 10 and the conduction portion 27 of the second base plate 20 can be surely conducted to each other with a simple structure. In particular, since the contact pin 27a and the connector 32 are connected to each other in a state in which the circuit board 31 is pressed by the movable member 240, positional deviation due to bending of the circuit board 31 can be prevented.

Embodiment 7

A test socket 1H according to Embodiment 7 of the present disclosure will be described with reference to FIGS. 18 and 19. For convenience of description, members having the same functions as those described in Embodiment 1 will be designated by the same reference symbols, and description thereof will not be repeated.

Figure 18:
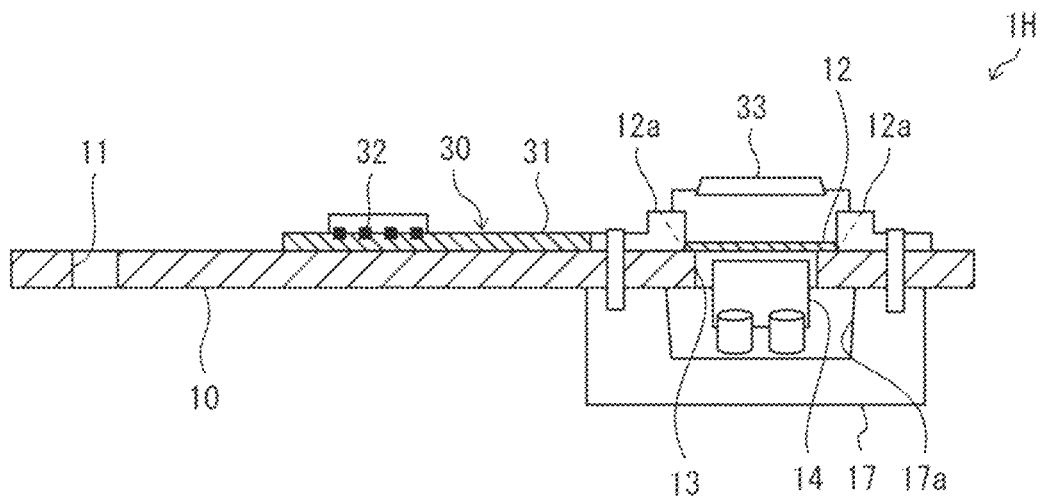
FIG. 18 is a side view of a test socket according to Embodiment 7 of the present disclosure.
Figure 19:
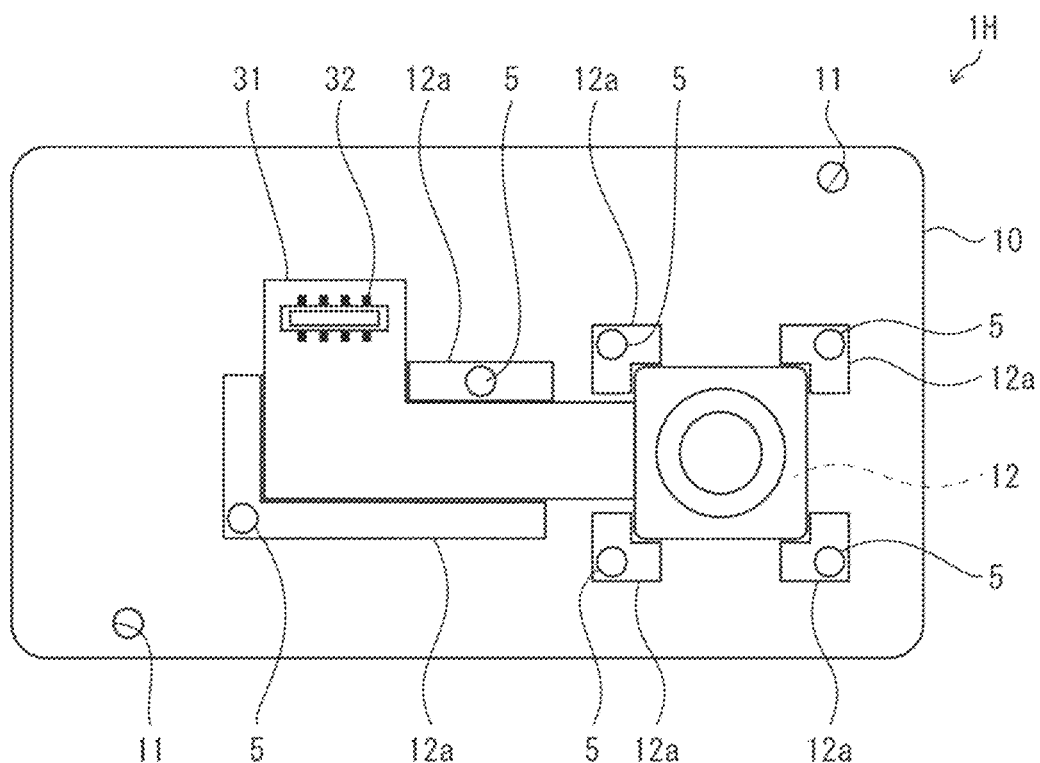
FIG. 19 is a perspective view illustrating the test socket of FIG. 18 when viewed from above.

FIG. 18 is a side view of the test socket 1H according to Embodiment 7 of the present disclosure. FIG. 19 is a perspective view illustrating the test socket 1H of FIG. 18 when viewed from above. As illustrated in FIGS. 18 and 19, the test socket 1H according to Embodiment 7 is an open top type test socket in which the second base plate 20 is not attached above the first base plate 10.

The first base plate 10 of the test socket 1H has the plurality of first positioning hole portions 11, the accommodation portion 12 that accommodates the optical module 30, the first opening portion 13, and the first pressing portion 14. The first base plate 10 is made of a non-magnetic conductor, for example, non-magnetic stainless steel, conductive-type UNILATE (resin material manufactured by Unitika Ltd.), or the like, and is electrically grounded via the first engagement portion 16.

The first base plate 10 is provided with two circular first positioning hole portions 11. The two first positioning hole portions 11 are respectively provided on the upper right end portion side and the lower left end portion side of the first base plate 10 illustrated in FIG. 19. A connection pin 4 that connects the test socket 1 and the tester is inserted through each first positioning hole portion 11.

The accommodation portion 12 has four first holding portions 12a protruding from a peripheral part thereof. These first holding portions 12a are fixed to the first base plate 10 by the fixing members 5 such as screws. The first holding portions 12a are arranged in a predetermined positional relationship with respect to the first positioning hole portions 11. In detail, the predetermined positional relationship is set such that the positional accuracy of the first holding portion 12a with respect to the first positioning hole portion 11 is, for example, ±50 µm or less.

For example, a circular first opening portion 13 is formed in the accommodation portion 12 at a position corresponding to the lens 33 of the optical module 30. For example, a cylindrical first pressing portion 14 is provided below the first opening portion 13. The accommodation member 17 is disposed below the first opening portion 13 of the first base plate 10. The accommodation member 17 is provided with a recess portion 17a at a position corresponding to the first opening portion 13. The first pressing portion 14 is accommodated in the recess portion 17a of the accommodation member 17. The first pressing portion 14 protrudes from the first opening portion 13 and presses the optical module 30 toward the second base plate 20 side.

According to the above-described test socket 1H in Embodiment 7, since it is not necessary to provide the second base plate 20, the optical module 30 can be disposed with high positioning accuracy with a simple configuration. Further, as the arrangement positions of the accommodation portion 12, the first holding portion 12a, and the first opening portion 13 of the first base plate 10 are adjusted with reference to the positions of the plurality of positioning hole portion 11, it is possible to cope with a change of the shape, the size, or the like of the optical module 30 at low cost with high accuracy.

SUMMARY

A test socket for an optical module according to a first aspect of the present disclosure includes: a first base plate that accommodates the optical module; and a second base plate that is detachably attached to the first base plate and sandwiches the optical module between the first base plate and the second base plate. The first base plate has: a plurality of first positioning hole portions; an accommodation portion that has a first holding portion disposed in a predetermined positional relationship with respect to the plurality of first positioning hole portions, and accommodates the optical module; a first opening portion that is formed in the accommodation portion; a first pressing portion that protrudes from the first opening portion and presses the optical module toward a side of the first base plate; a first hinge portion that rotatably attaches the second base plate; and a first engagement portion that is disposed at a position different from a position of the first hinge portion and engages with the second base plate.

The second base plate includes a plurality of second positioning hole portions that are arranged at positions corresponding to the plurality of first positioning hole portions of the first base plate; a second opening portion that is disposed at a predetermined positional relationship with respect to the plurality of second positioning hole portions and is disposed at a position corresponding to a lens of the optical module; a second holding portion that holds the optical module from the side of the second base plate; a conduction portion that is disposed at a position facing a connector of the optical module and includes a contact pin connected to the connector; a second pressing portion that presses a circuit board of the optical module; a substrate portion that is electrically connected to the contact pin of the conduction portion; a cover portion that protects the substrate portion; a second hinge portion that is connected to the first hinge portion; and a second engagement portion that is disposed at a position different from a position of the second hinge portion and engages with the first engagement portion.

According to the above configuration, the positions of the first positioning hole portions of the first base plate and the positions of the second positioning hole portions of the second base plate are aligned with each other, and the optical module is sandwiched between the first base plate and the second base plate, so that the optical module 30 can be disposed at a predetermined position of the accommodation portion of the first base plate with high accuracy within, for example, ±50 µm. In particular, when the shape, the size, or the like of the optical module is changed, only the first base plate is replaced and the position of each portion of the first base plate is adjusted, so that it is possible to cope with a change of the type of the optical module at low cost and with high accuracy.

In the test socket according to a second aspect of the present disclosure, in the first aspect, at least one of respective components of the first base plate may be detachably fixed to the first base plate with an adhesive or a fixing member, and at least one of respective components of the second base plate may be detachably fixed to the second base plate with an adhesive or a fixing member.

According to the above configuration, at least one of the respective components of the first base plate is detachably fixed to the first base plate with an adhesive or a fixing member, and at least one of the respective components of the second base plate is detachably fixed to the second base plate with an adhesive or a fixing member. Accordingly, the positions of the respective components of the first base plate and the respective components of the second base plate can be easily adjusted.

In a test socket according to a third aspect of the present disclosure, in the first aspect, the first base plate may have a plurality of the accommodation portions, a plurality of the second base plates may be attached to the first base plate, and the second base plates may have a substantially same height or may have partially different heights.

According to the above configuration, since the plurality of second base plates are attached to the first base plate having the plurality of accommodation portions to correspond to the plurality of accommodation portions, the plurality of optical modules can be arranged in the test socket with high positioning accuracy. Further, since the plurality of second base plates are independent base plates, the optical modules having different heights can be tested at one time, and the number of devices can be reduced.

In a test socket according to a fourth aspect of the present disclosure, in the first to third aspects, the first base plate has a slit portion and a biasing member that is accommodated in the slit portion. At least one of the first holding portion of the first base plate and the second holding portion of the second base plate may be biased toward a side of the optical module by the biasing member.

According to the above configuration, by biasing at least one of the first holding portion of the first base plate and the second holding portion of the second base plate toward the optical module by the biasing member, the positioning accuracy of the test socket on the optical module side can be improved.

In a test socket according to a fifth aspect of the present disclosure, in the first to fourth aspect, the first base plate and the second base plate are formed of a non-magnetic conductor, and are electrically grounded via the first engagement portion and the second engagement portion.

According to the above configuration, since the first base plate and the second base plate are made of a non-magnetic conductor and are electrically grounded via the first engagement portion and the second engagement portion, crosstalk and noise can be reduced.

In a test socket according to a sixth aspect of the present disclosure, in the first to fifth aspects, when the second base plate is conductive, a plurality of second through-holes, into which the contact pin arranged at a predetermined positional relationship from the second positioning hole portions is inserted, need to be insulated.

According to the above configuration, a plurality of second through-holes of the second base plate can be processed simultaneously with the positioning holes, so that the positional accuracy of the contact pin can be improved. Further, since the second through-hole is insulated, a short circuit can be prevented from occurring between the second through-hole and the contact pin.

In a test socket according to a seventh aspect of the present disclosure, in the first to fifth aspects, the test socket includes a third base plate that is attached to the second base plate. The third base plate may have a plurality of third positioning holes, the contact pin may be inserted into each of the plurality of third positioning holes and the third base plate may be positioned with respect to the second base plate with reference to the third positioning holes.

According to the above configuration, the third base plate has the plurality of third positioning holes through which the contact pins are inserted, and is positioned and fixed to the second base plate with reference to the third positioning holes. Accordingly, the positional accuracy of the contact pin can be improved and the attachment position can be adjusted, so that the contact pins can be prevented from coming off from the connector.

In a test socket for an optical module according to an eighth aspect of the present disclosure, in the first to seventh aspect, the first hinge portion of the first base plate has an insertion hole through which a hinge shaft is inserted and an elastic member that is accommodated in the insertion hole, and the conduction portion of the second base plate can be closed substantially in parallel to the first base plate.

According to the above configuration, the hinge shaft is pressed to the lower side of the insertion hole by an elastic force of the elastic member accommodated in the insertion hole of the first hinge portion, so that the optical module can be surely sandwiched between the first base plate and the second base plate of the test socket, and the positioning accuracy of the optical module to the test socket can be improved. Further, by disposing the conduction portion of the second base plate in parallel to the first base plate, the contact pin provided in the conduction portion can be vertically connected to the connector of the optical module accommodated in the accommodation portion of the first base plate with high accuracy.

In a test socket according to a ninth aspect of the present disclosure, in the first to eighth aspects, the second pressing portion of the second base plate may have a movable member that is elastically deformed in a pressing direction, the movable member of the second pressing portion may be disposed on the outer peripheral side of the contact pin of the conduction portion, and a change amount of the movable member of the second pressing portion in the pressing direction may be larger than a pressed amount of the contact pin of the conduction portion.

According to the above configuration, the movable member provided in the second pressing portion of the second base plate is disposed on the outer peripheral side of the contact pin, and the change amount of the movable member in the pressing direction is larger than the pressed amount of the contact pin. Accordingly, the connector of the optical module disposed in the first base plate and the conduction portion of the second base plate can be surely conducted to each other, and the positioning accuracy of the optical module to the test socket can be improved.

A test socket for an optical module according to a tenth aspect of the present disclosure includes a first base plate that accommodates the optical module. The first base plate has a plurality of first positioning hole portions, an accommodation portion that has a first holding portion disposed at a predetermined positional relationship with respect to the plurality of first positioning hole portions, and accommodates the optical module, a first opening portion that is formed in the accommodation portion, and a first pressing portion that protrudes from the first opening portion and presses the optical module toward a side of the first base plate.

According to the above configuration, a test socket the can cope with a change of the shape, the size. and the like of the optical module 30 at low cost and with high accuracy by adjusting the arrangement positions of the accommodation portion, the first holding portion, and the first opening portion of the first base plate with reference to the positions of the plurality of first positioning hole portions without providing the second base plate can be provided.

In a method of manufacturing the test socket according to the first aspect, according to an eleventh aspect of the present disclosure, the plurality of first positioning hole portions and the first opening of the first base plate and the plurality of second positioning hole portions and the second opening portion of the second base plate may be formed by etching.

According to the above method, the plurality of first positioning hole portions and the first opening portions of the first base plate and the plurality of second positioning hole portions and the second opening portion of the second base plate can be manufactured by etching, so that the manufacturing process can be reduced and the manufacturing costs can be reduced. Further, since the respective components of the first base plate and the respective components of the second base plate can be manufactured with high accuracy by etching, the positioning accuracy of the optical module can be improved.

The present disclosure is not limited to the above-described embodiments, various modifications can be obtained within the scope described in the aspects, and embodiments obtained by appropriately combining technical means disclosed in different embodiments are also included in the technical scope of the present disclosure. Further, a new technical feature can be formed by combining the technical means disposed in the respective embodiments.

The present disclosure contains subject matter related to that disclosed in Japanese Priority Patent Application JP 2019-158588 filed in the Japan Patent Office on Aug. 30, 2019, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A test socket for an optical module, the test socket comprising:
    a first base plate that accommodates the optical module; and
    a second base plate that is detachably attached to the first base plate and sandwiches the optical module between the first base plate and the second base plate, wherein
    the first base plate has
        a plurality of first positioning hole portions,
        an accommodation portion that has a first holding portion disposed in a predetermined positional relationship with respect to the plurality of first positioning hole portions, and accommodates the optical module,
        a first opening portion that is formed in the accommodation portion, a first pressing portion that protrudes from the first opening portion and presses the optical module toward a side of the second base plate, a first hinge portion that rotatably attaches the second base plate, and a first engagement portion that is disposed at a position different from a position of the first hinge portion and engages with the second base plate, and the second base plate has a plurality of second positioning hole portions that are arranged at positions corresponding to the plurality of first positioning hole portions of the first base plate, a second opening portion that is disposed at a predetermined positional relationship with respect to the plurality of second positioning hole portions and is disposed at a position corresponding to a lens of the optical module, a second holding portion that holds the optical module from the side of the second base plate, a conduction portion that is disposed at a position facing a connector of the optical module and includes a contact pin connected to the connector, a second pressing portion that presses a circuit board of the optical module, a substrate portion that is electrically connected to the contact pin of the conduction portion, a cover portion that protects the substrate portion, a second hinge portion that is connected to the first hinge portion; and a second engagement portion that is disposed at a position different from a position of the second hinge portion and engages with the first engagement portion.

2. The test socket according to claim 1, wherein at least one of respective portions of the first base plate is detachably fixed to the first base plate with an adhesive or a fixing member, and at least one of respective portions of the second base plate is detachably fixed to the second base plate with an adhesive or a fixing member.

3. The test socket according to claim 1, wherein the first base plate has a plurality of accommodation portions, each of which being the accommodation portion that has the first holding portion disposed in a predetermined positional relationship with respect to the plurality of first positioning hole portions, and accommodates the optical module, a plurality of second base plates are attached to the first base plate, each of which being the second base plate that is detachably attached to the first base plate and sandwiches the optical module between the first base plate and the second base plate, and the plurality of second base plates have a substantially same height or partially different heights.

4. The test socket according to claim 1, wherein the first base plate has a slit portion and a biasing member accommodated in the slit portion, and at least one of the first holding portion of the first base plate and the second holding portion of the second base plate is biased toward a side of the optical module by the biasing member.

5. The test socket according to claim 1, wherein the first base plate and the second base plate are formed of a non-magnetic conductor, and are electrically grounded through the first engagement portion and the second engagement portion.

6. The test socket according to claim 1, further comprising:

a third base plate that is attached to the second base plate, wherein the third base plate has a plurality of third positioning holes, the contact pin is inserted into each of the plurality of third positioning holes, and the third base plate is positioned with respect to the second base plate with reference to the plurality of third positioning holes.

7. The test socket according to claim 1, wherein the test socket is for the optical module, the first hinge portion of the first base plate has an insertion hole through which a hinge shaft is inserted and an elastic member accommodated in the insertion hole, and the conduction portion of the second base plate is disposed in parallel to the first base plate.

8. The test socket according to claim 1, wherein the second pressing portion of the second base plate has a movable member that is elastically deformed in a pressing direction, the movable member of the second pressing portion is disposed on an outer peripheral side of the contact pin of the conduction portion, and a change amount of the movable member of the second pressing portion in the pressing direction is larger than a pressed amount of the contact pin of the conduction portion.

9. A test socket for an optical module, comprising:

a first base plate that accommodates the optical module, wherein the first base plate has a plurality of first positioning hole portions, an accommodation portion that has a first holding portion disposed in a predetermined positional relationship with respect to the plurality of first positioning hole portions, and accommodates the optical module, a first opening portion that is formed in the accommodation portion, a first pressing portion that protrudes from the first opening portion and presses the optical module toward a side of the first base plate.

10. A method of manufacturing the test socket according to claim 1, the method comprising:

forming the plurality of first positioning hole portions and the first opening portion of the first base plate and the plurality of second positioning hole portions and the second opening portion of the second base plate by etching.

* * * * *